(12) United States Patent
Moosa et al.

(10) Patent No.: US 12,719,478 B2
(45) Date of Patent: Aug. 25, 2026

(54) SYSTEM HAVING SINGLE-EVENT LATCH-UP DETECTION AND MITIGATION

(71) Applicant: NXP USA, INC., Austin, TX (US)

(72) Inventors: Mohamed Suleman Moosa, Austin, TX (US); Gary Edwin Anderson, II, Austin, TX (US); Mehul D. Shroff, Austin, TX (US); George Walter Lange, Austin, TX (US); Antoine Fabien Dubois, Austin, TX (US)

(73) Assignee: NXP USA, Inc., Austin, TX (US)

( * ) Notice: Subject to any disclaimer, the term of this patent is extended or adjusted under 35 U.S.C. 154(b) by 454 days.

(21) Appl. No.: 18/308,328

(22) Filed: Apr. 27, 2023

(65) Prior Publication Data

US 2024/0364342 A1 Oct. 31, 2024

(51) Int. Cl.
*H03K 3/356* (2006.01)
*H03K 19/08* (2006.01)
*H03K 19/17784* (2020.01)

(52) U.S. Cl.
CPC ......... *H03K 19/0813* (2013.01); *H03K 3/356* (2013.01); *H03K 19/17784* (2013.01)

(58) Field of Classification Search
CPC ......... H02M 3/33538; H02M 3/33546; H02M 3/33515; H02M 3/33576; H02M 3/33553; H02M 3/33507; H02M 3/33592; H02M 3/33523; H02M 3/3353; H02M 3/33569
See application file for complete search history.

(56) References Cited

U.S. PATENT DOCUMENTS 5,841,643 A * 11/1998 Schenkel .......... H02M 3/33507 363/21.16
5,923,830 A 7/1999 Fuchs et al.
8,896,978 B2 11/2014 Baumann
9,793,899 B1 10/2017 Maillard et al.
9,823,679 B2 11/2017 Wilberg et al.
9,928,143 B2 3/2018 Dickey et al.
9,960,593 B2 5/2018 Vail et al.
10,048,997 B2 8/2018 Manojlovic et al.
10,713,118 B2 7/2020 Swenson
10,886,723 B2 1/2021 Vail et al.
2014/0070881 A1* 3/2014 Annes .................... H03F 3/193 330/192

(Continued)

FOREIGN PATENT DOCUMENTS

WO 2021084073 A1 5/2021

OTHER PUBLICATIONS

Ball, D.R., "Single-Event Latchup in a 7-nm Bulk FinFET Technology", IEEE Transactions on Nuclear Science, vol. 68, No. 5, May 2021.

(Continued)

*Primary Examiner* — Bryan R Perez

(57) ABSTRACT

A method of detecting and mitigating an SEL is provided. The method includes measuring a current of a first circuit block of a semiconductor device and determining that the measured current exceeds a first threshold. In response to the measured current exceeding the first threshold, a supply voltage of the first circuit block is reduced from a nominal voltage value to a predetermined voltage value. After reducing the supply voltage to the predetermined voltage value, the supply voltage is restored to the nominal voltage value.

20 Claims, 3 Drawing Sheets

(56) References Cited

U.S. PATENT DOCUMENTS

2023/0072786 A1 * 3/2023 Morita .................. B60L 3/0092

OTHER PUBLICATIONS

Petrovic, V., "Integrated Single Event Latchup Protection for ASICs used in Space Applications", 21st Telecommunications forum TELFOR 2013, Nov. 26-28, 2013.
Petrovic, V., "Redundant Circuits with Latchup Protection", 2013 IEEE 20th International Conference on Electronics, Circuits and Systems (ICECS), Dec. 8-10, 2013.
Pieper, N.J., "Single-Event Latchup Vulnerability at the 7-nm FinFET Node", 2022 IEEE International Reliability Physics Symposium (IRPS), Mar. 27-31, 2022.
Tausch, J., "Neutron Induced Micro SEL Events in COTS SRAM Devices," 2007 IEEE Radiation Effects Data Workshop, 2007, pp. 185-188, Jul. 23-27, 2007.

* cited by examiner

SYSTEM HAVING SINGLE-EVENT LATCH-UP DETECTION AND MITIGATION

BACKGROUND

Field

This disclosure relates generally to semiconductor device systems, and more specifically, to semiconductor device system having single-event latch-up detection and mitigation.

Related Art

Today, there is an increasing trend to include sophisticated semiconductor devices in products and systems that are used every day. These sophisticated semiconductor devices may include sensitive circuitry which may be susceptible to environmental events, for example. For some high reliability and functional safety applications, such environmental events could be catastrophic to these applications. Accordingly, significant challenges exist in accommodating semiconductor devices with such sensitive circuitry while minimizing the impact on the reliability, performance, and costs of the semiconductor devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a semiconductor device system having single-event latch-up detection and mitigation. The semiconductor device system includes a system controller and power management unit coupled to a circuit block of an integrated circuit. The system is configured to provide a voltage supply signal to the circuit block and to monitor current supplied to the circuit block. If a monitored current exceeds a predetermined current threshold, a single-event latch-up of the circuit block may be detected. Upon the monitored current exceeding a current threshold, the system is configured to reduce the voltage value of the voltage supply signal to a voltage value lower than a hold voltage of a parasitic silicon-controlled rectifier. The system reduces the voltage value below the hold value for a time period sufficient to clear the latch-up condition. After the single-event latch-up is cleared, the system restores the voltage supply signal to a voltage value prior to the detection of the single-event latch-up. By clearing the single-event latch-up in this manner, impact to functional safety systems may be minimized. In addition, traditional single-event latch-up mitigation techniques which include costly wafer starting materials and area-restrictive design rules may be avoided.

Figure 1:
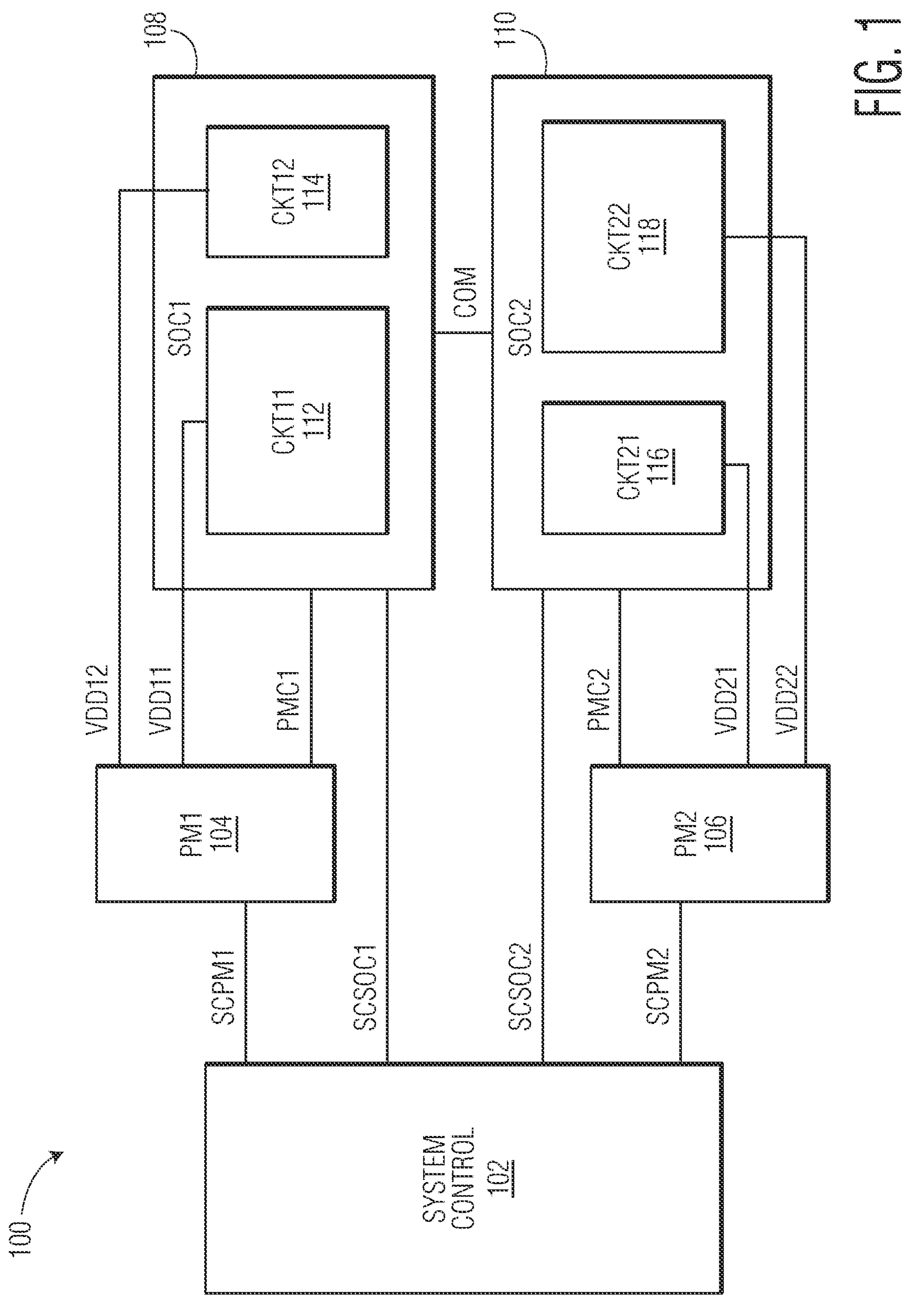
FIG. 1 illustrates, in a simplified block diagram view, an example semiconductor device system configured for detection and mitigation of single-event latch-up (SEL) in accordance with an embodiment.

FIG. 1 illustrates, in a simplified block diagram view, an example semiconductor device system 100 configured for detection and mitigation of single-event latch-up (SEL) in accordance with an embodiment. In this embodiment, the semiconductor device system 100 includes a system controller 102 labeled SYSTEM CONTROL, power management units 104 and 106, labeled PM1 and PM2 respectively, and system on chip (SoC) units 108 and 110, labeled SOC1 and SOC2 respectively. The first SoC unit 108 includes circuit blocks 112 and 114, labeled CKT11 and CKT12 respectively, and the second SoC unit 110 includes circuit blocks 116 and 118, labeled CKT21 and CKT22 respectively.

In this embodiment, the system controller 102 is coupled to each of the power management units 104 and 106 and each of the SoC units 108 and 110. The system controller 102 may include functional circuit blocks such as a processing unit (e.g., finite state machine, central processing unit), memory, timer, communication, reset and clock circuitry, for example. The system controller 102 may be configured to execute instructions in order to carry out programmed tasks. Tasks may include boot-up sequencing, reset and clocks enable/disable, interrupts, communication with power management units 104 and 106 and SoC units 108 and 110, and fault detection and mitigation initiation steps, for example.

System control signals, labeled SCSOC1 and SCSOC2, are coupled between the system controller 102 and respective SoC units 108 and 110. The SCSOC1 and SCSOC2 signals may include any number of signal lines configured for unidirectional and/or bidirectional communication between the system controller 102 and respective SoC units 108 and 110. System control signals, labeled SCPM1 and SCPM2, are coupled between the system controller 102 and respective power management units 104 and 106. Likewise, the SCPM1 and SCPM2 signals may include any number of signal lines configured for unidirectional and/or bidirectional communication between the system controller 102 and respective power management units 104 and 106. Communication by way of the SCSOC1, SCSOC2, SCPM1, and SCPM2 control signals may include signals such as address, data, interrupt, serial communication, clock, reset, and the like.

The power management units 104 and 106 are coupled to respective SoC units 108 and 110 in this embodiment. The power management units 104 and 106 may include circuit blocks such as a voltage regulator, a DC-to-DC voltage converter, and communication circuitry, for example. In this embodiment, the power management units 104 and 106 are configured to provide voltage domain supply signals VDD11, VDD12, VDD21, and VDD22 to respective circuit blocks 112, 114, 116, and 118 of SoC units 108 and 110. The power management units 104 and 106 are further configured to adjust voltage values and measure supplied currents associated with these supply signals. For example, the power management unit 104 is coupled to provide the VDD11 voltage supply signal to the circuit block 112 and may adjust the voltage value of the voltage supply signal based on operating modes (e.g., active, standby, quiescent, state-retention) and events (e.g., faults, errors).

Power management control signals, labeled PMC1 and PMC2, are coupled between the power management units 104 and 106 and respective SoC units 108 and 110. The PMC1 and PMC2 signals may include any number of signal lines configured for unidirectional and/or bidirectional communication between the system controller 102 and respective SoC units 108 and 110. Inter-SoC communication link, labeled COM, is coupled between the SoC units 108 and 110. The COM link may include any number of signal lines configured for unidirectional and/or bidirectional communication between the SoC units 108 and 110. For example, the COM link may be formed as an Ethernet link configured for bidirectional communication between SoC units 108 and 110.

The SoC unit 108 may be characterized as a system formed on a semiconductor die. In this embodiment, the SoC unit 108 is depicted with two functional circuit blocks 112 and 114. The size and number of circuit blocks 112 and 114 are chosen for illustration purposes. Each of the circuit blocks 112 and 114 may include any of digital circuits, analog circuits, RF circuits, memory, processor, communication, MEMS, sensor, the like, and combinations thereof. For example, the circuit clock 112 may be characterized as a central processing unit (CPU) and the circuit block 114 may be characterized as a memory. Features of the SoC unit 108 such as I/O pads and circuitry, other circuit blocks, interconnecting signal lines, peripheral circuitry, and the like are not shown for illustration purposes.

The SoC unit 110 may be characterized as a system formed on the same semiconductor die of the SoC unit 108 or as a system formed on a different (e.g., separate) semiconductor die. In this embodiment, the SoC unit 110 is depicted with two functional circuit blocks 116 and 118. The size and number of circuit blocks 116 and 118 are chosen for illustration purposes. Each of the circuit blocks 116 and 118 may include any of digital circuits, analog circuits, RF circuits, memory, processor, communication, MEMS, sensor, the like, and combinations thereof. For example, the circuit block 116 may be characterized as an analog-to-digital converter (ADC) and the circuit block 118 may be characterized as a digital signal processor (DSP). Features of the SoC unit 110 such as input/output (I/O) pads and circuitry, other circuit blocks, interconnecting signal lines, peripheral circuitry, and the like are not shown for illustration purposes.

In some embodiments, the SoC unit 108 and the SoC unit 110 may be formed to have substantially similar functional circuit blocks. For example, the SoC unit 108 and the SoC unit 110 together may be included in a fault-tolerant system having one of the SoC units configured to operate in lockstep manner with the other SoC unit thus allowing a mismatch of signals (e.g., address, data) to be detectable by the system controller 102 as a fault.

In this embodiment, the power management units 104 and 106 are configured to monitor and measure currents of the respective circuit blocks 112, 114, 116, and 118. The currents sourced by way of the VDD11, VDD12, VDD21, and VDD22 voltage domain supply signals may be monitored by measuring each of these currents at predetermined time intervals (e.g., 10's to 100's of milliseconds). For example, tracking the measured currents over a predetermined period may allow abnormal operation to be detectable. Baseline current values may be established by measuring typical or normal currents at regular time intervals during one or more operational modes (e.g., active, standby, quiescent, state-retention) for each of the circuit blocks 112, 114, 116, and 118. The baseline current values may be stored as average current values for each of the one or more operational modes per circuit blocks 112, 114, 116, and 118. Current thresholds are created based on these predetermined baseline current values such that fault events and/or error events may be detectable when monitored currents exceed a current threshold.

For discussion purposes, the operational modes as used herein may be characterized according to the following: The active mode generally refers to a functional circuit block actively being used to perform functions as intended (e.g., processing, reading and/or writing, shifting, counting, comparing, and the like). The standby mode generally refers to the functional circuit block being inactive (e.g., power-saving sleep state). The quiescent mode generally refers to the functional circuit block being in a quiet state (e.g., not actively performing functions) but ready to perform functions. The state-retention mode generally refers to the functional circuit block being inactive and having the voltage domain supply for the functional circuit block reduced to a minimum voltage value sufficient to retain logic states stored in latches, flip-flops, memory cells, and the like.

The system controller 102 together with the power management units 104 and 106 may serve as a system watchdog (e.g., for SEL). For example, a monitored current by way of the power management units 104 and 106 may be determined to exceed a current threshold thus causing an alert indication (e.g., flag, interrupt) to be provided to the system controller 102 by way of the SCPM1 and SCPM2 control signals. The monitored current which exceeds such current threshold may be characterized as an abnormal current. The system controller 102 may in turn initiate a mitigation process which may instruct a corresponding power management unit to adjust (e.g., reduce) a voltage value of a voltage supply signal to a predetermined value. Characteristics of abnormal currents may include fast rise times (e.g., on the order of picoseconds) and persistence of the abnormal current. In this embodiment, an abnormal current may typically be limited to one functional circuit block out of a plurality of functional circuit blocks (e.g., circuit blocks 112, 114, 116, and 118) on a semiconductor chip and therefore may be an indication of a condition characterized as an SEL.

In this embodiment, the mitigation process initiated by the system controller 102 may be programmed to direct steps such as: protecting other system components (e.g., functional circuit blocks) from potentially corrupted outputs of the abnormal current circuit block, clearing the SEL condition by reducing the voltage value of the corresponding voltage supply signal to a predetermined value (e.g., below SCR holding voltage) sufficient to dissipate the latch-up condition, restoring the voltage value of the corresponding voltage supply signal to an operating voltage value prior to the detection of the SEL, and logging the SEL and pertinent attributes (e.g., voltage, current, operating mode) which may be useful for further health monitoring of the system.

Figure 2:
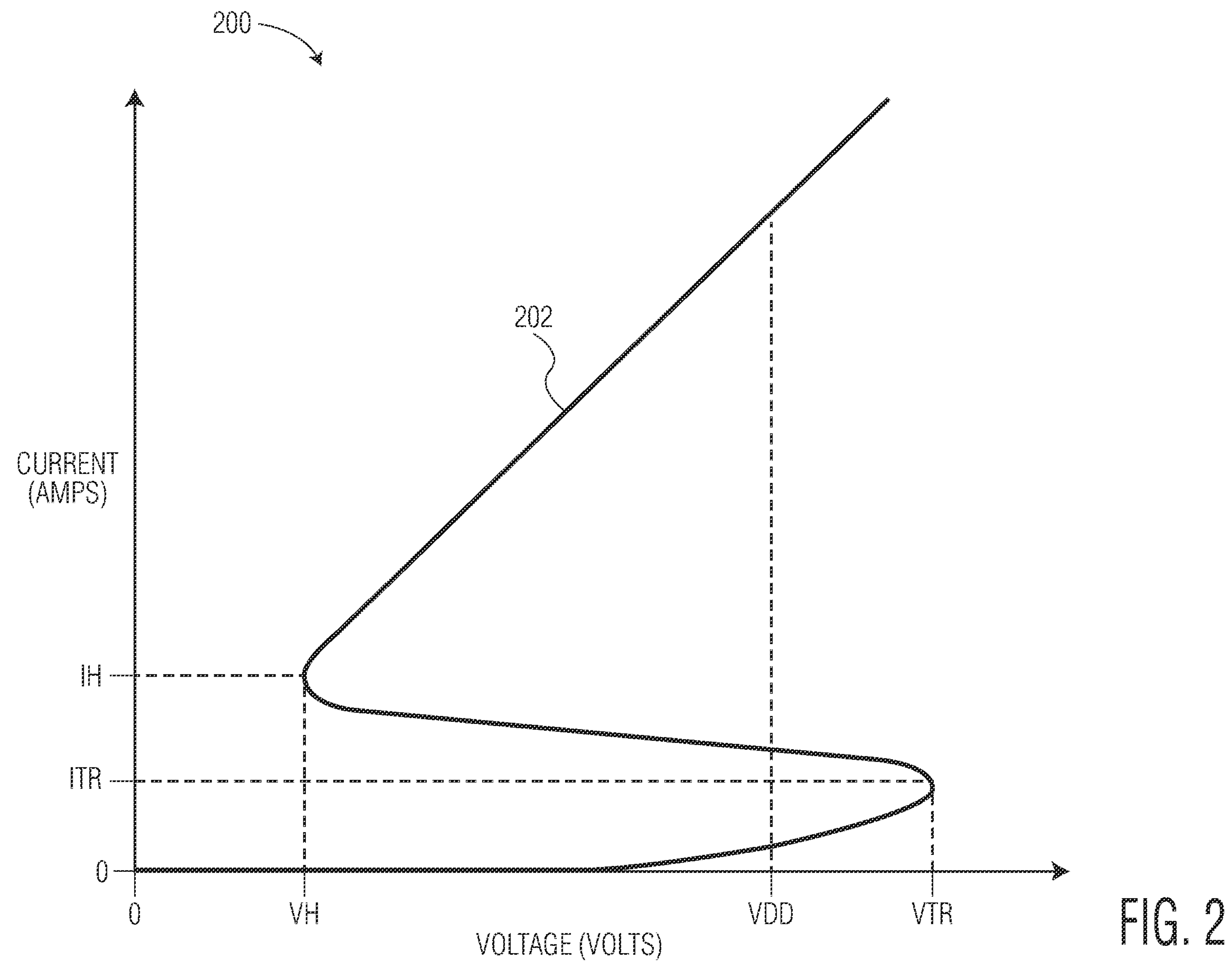
FIG. 2 illustrates, in a simplified graphical view, an example current-voltage waveform of a parasitic silicon-controlled rectifier (SCR) in accordance with an embodiment.

FIG. 2 illustrates, in a simplified graphical view, an example current-voltage plot 200 characteristic of a parasitic silicon-controlled rectifier (SCR) in accordance with an embodiment. The current versus voltage plot 200 includes a waveform 202 of a parasitic SCR for an example process technology. Voltage values in Volts are indicated on the X-axis labeled VOLTAGE, and corresponding current values in Amperes are indicated on the Y-axis labeled CURRENT. The waveform 202 is an example waveform representative of two operating points of the SCR modeled by cross-coupled parasitic bipolar junction transistors (BJTs) found in typical CMOS circuits.

During a first operating point characterized as normal operation, a nominal operating voltage, labeled VDD on the X-axis, is applied to the anode of the parasitic SCR causing a corresponding nominal (e.g., negligible) current to flow through the SCR. Increasing the voltage at the anode to a trigger voltage or breakdown voltage value, labeled VTR on the X-axis, causes the SCR to turn on and enter a latch-up condition characterized as a second operating point. The corresponding trigger current, labeled ITR on the Y-axis is significantly higher than the nominal current during normal operation. The latch-up condition continues while the voltage at the anode of the SCR is at or above the holding voltage, labeled VH on the X-axis. During the latch-up condition, as the voltage at the anode is increased from VH, the corresponding current flowing through the SCR increases from a hold current value labeled IH on the Y-axis. Resulting current values during the latch-up condition may be several orders of magnitude higher than during normal operation. Normal operation (e.g., SCR turned off) may be restored by reducing the voltage at the anode of the SCR below the VH value.

Figure 3:
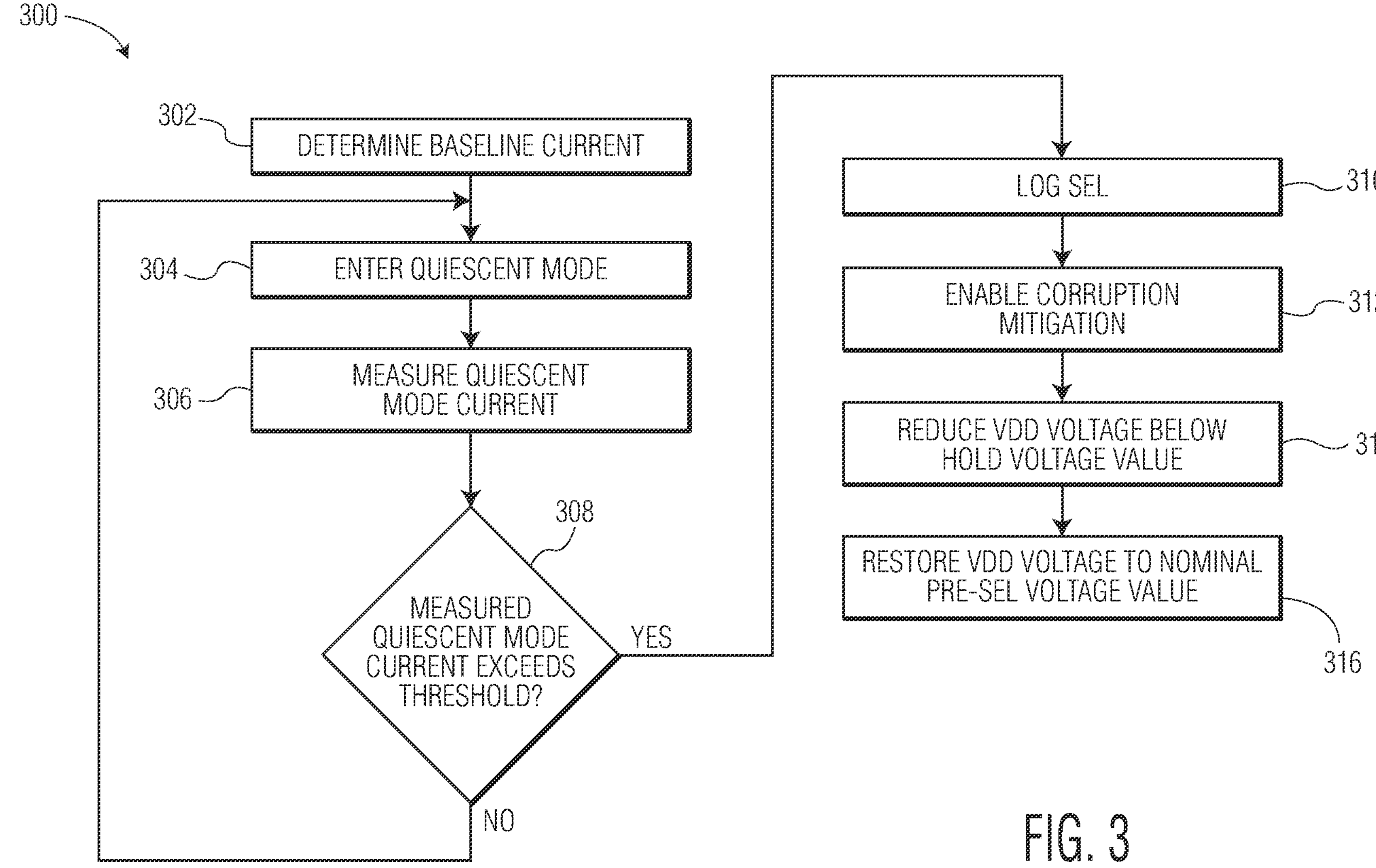
FIG. 3 illustrates, in a simplified flow diagram view, an example method for detecting and mitigating an SEL in accordance with an embodiment.

FIG. 3 illustrates, in a simplified flow diagram view, an example method 300 for detecting and mitigating an SEL in accordance with an embodiment. The method 300 is based on the example semiconductor device system 100 depicted in FIG. 1. In this embodiment, steps 302-308 of the method 300 include detecting an SEL and steps 310-316 include mitigating the SEL.

At step 302, determine baseline current. In this embodiment, baseline current values may be established by measuring currents sourced by way of the VDD11, VDD12, VDD21, and VDD22 voltage domain supply signals of FIG. 1 during one or more operational modes such as active, standby, quiescent, state-retention modes, and the like. The baseline current values may be stored as average current values for each of the respective circuit blocks 112, 114, 116, and 118 during the one or more operational modes. Current thresholds are created based on these predetermined baseline current values such that fault events and/or error events may be detectable when monitored currents exceed a current threshold. For example, the predetermined current thresholds may be created by adding a sufficient margin to baseline current values to accommodate manufacturing process and environmental variability. For brevity purposes, discussion of the subsequent steps of the method 300 will be referenced to the quiescent mode.

At step 304, enter quiescent mode. In this embodiment, a monitored functional circuit block (e.g., one of circuit blocks 112, 114, 116, and 118 of FIG. 1) enters a quiescent mode. A power management unit (e.g., one of power management units 104 and 106 of FIG. 1) is coupled to the functional circuit block such that current supplied to the functional circuit block can measured and monitored.

At step 306, measure quiescent mode current. In this embodiment, the power management unit measures the current supplied to the monitored functional circuit block during the quiescent mode. The current sourced by the power management unit may be monitored by measuring the supplied current during the quiescent mode at predetermined time intervals. For example, tracking the measured quiescent mode current over a predetermined period may be useful to generate a quiescent mode average current value while minimizing spurious current spikes from being detectable as an abnormal current.

At step 308, determine whether the measured quiescent mode current exceeds a threshold. In this embodiment, the measured quiescent mode current is compared with a predetermined quiescent mode current threshold. If the measured quiescent mode current exceeds the predetermined threshold, then (YES) proceed at step 310. For example, the predetermined threshold may be based on the predetermined quiescent mode baseline current value plus an offset (e.g., margin for process and environmental variability), such that fault events and/or error events may be detectable when monitored quiescent mode currents exceed the current threshold. In this embodiment, if the quiescent mode current is determined to exceed the predetermined quiescent mode current threshold, an SEL condition may be detected. If the measured quiescent mode current is within the predetermined quiescent mode current threshold, then (NO) proceed at step 304.

At step 310, log SEL. In this embodiment, when the monitored quiescent mode current is determined to exceed the predetermined quiescent mode current threshold, an alert indication such as a flag or interrupt is provided to the system controller 102 of FIG. 1. The system controller in turn logs an event (e.g., SEL) in memory. The monitored quiescent mode current which exceeds the quiescent mode current threshold may be characterized as an abnormal quiescent mode current. The system controller may further log characteristics of abnormal quiescent mode current such as rise time, duration, and current value amount over the current threshold. The logged event and associated characteristics of the abnormal quiescent mode current may be useful for further health monitoring of the semiconductor device system 100 of FIG. 1.

At step 312, enable corruption mitigation. In this embodiment, the system controller initiates corruption mitigation steps when the monitored quiescent mode current is determined to exceed the predetermined quiescent mode current threshold. The corruption mitigation steps may allow for safe continued operation of the semiconductor device system 100 even though a functional circuit block may be impacted by an SEL condition. For example, the functional circuit block impacted by the SEL may be at risk of outputting corrupted data, control signals, and the like. The system controller's mitigation steps may be configured to prevent such corrupted data, etc., from affecting other system circuit blocks.

At step 314, reduce VDD voltage below hold voltage value. In this embodiment, after the monitored quiescent mode current is determined to exceed the predetermined quiescent mode current threshold, the system controller is programmed to clear the SEL. For example, the system controller directs the power management unit coupled to the SEL-impacted functional circuit block to reduce the voltage value of the corresponding voltage supply signal (e.g., one of voltage domain supply signals VDD11, VDD12, VDD21, and VDD22 of FIG. 1) to a predetermined value for a duration sufficient to clear the latch-up condition of the SEL. In this embodiment, the predetermined voltage value is characterized as a voltage value lower than the SCR holding voltage (e.g., VH of FIG. 2) and greater than ground.

At step 316, restore VDD voltage to nominal pre-SEL voltage value. In this embodiment, after the power management unit reduced the voltage value of the corresponding voltage supply signal below the SCR holding voltage for a sufficient duration to clear the latch-up condition of the SEL, the power management unit is directed to restore the voltage supply signal to a nominal voltage value before the SEL was detected. For example, the functional circuit block may have been operating at a nominal voltage value such as 1.2 Volts prior to being impacted by the SEL condition. After the SEL is cleared, the corresponding voltage supply signal may be restored to the exemplary value of 1.2 Volts, value such that normal operation of the functional circuit block may resume.

Generally, there is provided, a method including measuring a current of a first circuit block of a semiconductor device; determining that the measured current exceeds a first threshold; in response to the measured current exceeding the first threshold, reducing a supply voltage of the first circuit block from a nominal voltage value to a predetermined voltage value; and after reducing the supply voltage to the predetermined voltage value, restoring the supply voltage to the nominal voltage value. The measured current exceeding the first threshold may be a measured quiescent mode current which occurs during a quiescent mode of the first circuit block. The measured quiescent mode current exceeding the first threshold may be indicative of a latch-up condition within the first circuit block. The supply voltage may be restored to the nominal voltage value after a predetermined time period from reducing the supply voltage of the first circuit block from the nominal voltage value. The semiconductor device may include a second circuit block and wherein reducing the supply voltage of the first circuit block to the predetermined voltage value does not affect the supply voltage of the second circuit block. The method may further include determining an average current baseline, the first threshold based on the average current baseline. In response to the measured current exceeding the first threshold the method may further include logging a first event in a memory. In response to the measured current exceeding the first threshold the method may further include enabling mitigation of data corruption associated with the first circuit block. The predetermined voltage value may be characterized as a voltage value less than a hold voltage value of a parasitic silicon-controlled rectifier and greater than a ground voltage.

In another embodiment, there is provided, a semiconductor device including a first circuit block configured and arranged to receive a first voltage supply signal; and a power management unit configured and arranged to provide the first voltage supply signal to the first circuit block, measure current of the first circuit block, reduce the first voltage supply signal from a nominal voltage value to a predetermined voltage value based on the measured current exceeding a first threshold, and restore the first voltage supply signal to the nominal voltage value after reducing the first voltage supply signal to the predetermined voltage value. The measured current exceeding the first threshold may be measured during a quiescent mode of the first circuit block. The measured current exceeding the first threshold may be indicative of a latch-up condition within the first circuit block. The power management unit may be further configured to restore the first voltage supply signal to the nominal voltage value after a predetermined time period from reducing the first voltage supply signal to the predetermined voltage value. The semiconductor device may further include a second circuit block configured and arranged to receive a second voltage supply signal, the power management unit further configured to provide the second voltage supply signal to the second circuit block and to reduce the first voltage supply signal from the nominal voltage value to the predetermined voltage value without affecting the second voltage supply signal. The first circuit block and the second circuit block may be collocated as an integrated circuit on a semiconductor die.

In yet another embodiment, there is provided, a method including providing, by way of a power management unit, a first voltage supply signal to a first circuit block of a semiconductor device; measuring a current of the first circuit block; reducing the first voltage supply signal from a nominal voltage value to a predetermined voltage value based on the measured current exceeding a first threshold; and restoring the first voltage supply signal to the nominal voltage value after reducing the first voltage supply signal to the predetermined voltage value. The measured current exceeding the first threshold may be a quiescent mode current measured during a quiescent mode of the first circuit block. The measured quiescent mode current exceeding the first threshold may be indicative of a latch-up condition within the first circuit block. The supply voltage may be restored to the nominal voltage value after a predetermined time period from reducing the supply voltage of the first circuit block from the nominal voltage value. The semiconductor device may include a second circuit block and wherein reducing the supply voltage of the first circuit block to the predetermined voltage value does not affect the supply voltage of the second circuit block.

By now, it should be appreciated that there has been provided a semiconductor device system having single-event latch-up detection and mitigation. The semiconductor device system includes a system controller and power management unit coupled to a circuit block of an integrated circuit. The system is configured to provide a voltage supply signal to the circuit block and to monitor current supplied to the circuit block. If a monitored current exceeds a predetermined current threshold, a single-event latch-up of the circuit block may be detected. Upon the monitored current exceeding a current threshold, the system is configured to reduce the voltage value of the voltage supply signal to a voltage value lower than a hold voltage of a parasitic silicon-controlled rectifier. The system reduces the voltage value below the hold value for a time period sufficient to clear the latch-up condition. After the single-event latch-up is cleared, the system restores the voltage supply signal to a voltage value prior to the detection of the single-event latch-up. By clearing the single-event latch-up in this manner, impact to functional safety systems may be minimized. In addition, traditional single-event latch-up mitigation techniques which include costly wafer starting materials and area-restrictive design rules may be avoided.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:

measuring a current of a first circuit block of a semiconductor device which comprises a parasitic silicon-controlled rectifier (SCR);

determining that the measured current exceeds a first threshold set based on a quiescent mode current and indicative of when the SCR turns on and enters into a latch up condition;

in response to the measured current exceeding the first threshold, reducing a supply voltage to an anode of the SCR of the first circuit block from a nominal voltage value to a predetermined voltage value greater than a ground voltage but less than a holding voltage, the holding voltage being a voltage where current through the SCR increases as a voltage applied to the SCR increases from the holding voltage during the latch up condition; and after reducing the supply voltage to the anode of the SCR to the predetermined voltage value greater than the ground voltage and waiting for a single event latch-up to clear, restoring the supply voltage to the anode of the SCR to the nominal voltage value.

2. The method of claim 1, wherein the measured current exceeding the first threshold is a measured quiescent mode current which occurs during a quiescent mode of the first circuit block.

3. The method of claim 2, wherein the measured quiescent mode current exceeding the first threshold is indicative of a latch-up condition within the first circuit block.

4. The method of claim 1, wherein the supply voltage is restored to the nominal voltage value after a predetermined time period from reducing the supply voltage of the first circuit block from the nominal voltage value.

5. The method of claim 1, wherein the semiconductor device includes a second circuit block and wherein reducing the supply voltage of the first circuit block to the predetermined voltage value does not affect the supply voltage of the second circuit block.

6. The method of claim 1, further comprising determining an average current baseline, the first threshold based on the average current baseline.

7. The method of claim 1, wherein in response to the measured current exceeding the first threshold further includes logging a first event in a memory.

8. The method of claim 1, wherein in response to the measured current exceeding the first threshold further includes enabling mitigation of data corruption associated with the first circuit block.

9. The method of claim 1, wherein the predetermined voltage value is characterized as a voltage value less than a hold voltage value of the parasitic silicon-controlled rectifier and greater than a ground voltage.

10. A semiconductor device comprising:

a first circuit block configured with a parasitic silicon-controlled rectifier (SCR) and arranged to receive a first voltage supply signal applied at an anode of the SCR; and a power management unit configured and arranged to:

provide the first voltage supply signal to the first circuit block, measure current of the first circuit block, reduce the first voltage supply signal from a nominal voltage value to a predetermined voltage value greater than a ground voltage based on the measured current exceeding a first threshold set based on a quiescent mode current and indicative of when the SCR turns on and enters into a latch up condition, the predetermined voltage being less than a holding voltage where current through the SCR increases as a voltage applied to the SCR increases from the holding voltage during the latch up condition, and restore the first voltage supply signal to the nominal voltage value after reducing the first voltage supply signal to the predetermined voltage value greater than the ground voltage and waiting for a single-event latch up to clear.

11. The semiconductor device of claim 10, wherein the measured current exceeding the first threshold is measured during a quiescent mode of the first circuit block.

12. The semiconductor device of claim 10, wherein the measured current exceeding the first threshold is indicative of a latch-up condition within the first circuit block.

13. The semiconductor device of claim 10, wherein the power management unit is further configured to restore the first voltage supply signal to the nominal voltage value after a predetermined time period from reducing the first voltage supply signal to the predetermined voltage value.

14. The semiconductor device of claim 10, further comprising a second circuit block configured and arranged to receive a second voltage supply signal, the power management unit further configured to provide the second voltage supply signal to the second circuit block and to reduce the first voltage supply signal from the nominal voltage value to the predetermined voltage value without affecting the second voltage supply signal.

15. The semiconductor device of claim 14, wherein the first circuit block and the second circuit block are collocated as an integrated circuit on a semiconductor die.

16. A method comprising:

providing, by way of a power management unit, a first voltage supply signal to a first circuit block of a semiconductor device which comprises a parasitic silicon-controlled rectifier (SCR);

measuring a current of the first circuit block;

reducing the first voltage supply signal from a nominal voltage value to a predetermined voltage value greater than a ground voltage based on the measured current exceeding a first threshold set based on a quiescent mode current and indicative of when the SCR turns on and enters into a latch up condition, the predetermined voltage being less than a holding voltage where current through the SCR increases as a voltage applied to the SCR increases from the holding voltage during the latch up condition; and restoring the first voltage supply signal to the nominal voltage value after reducing the first voltage supply signal to the predetermined voltage value greater than the ground voltage and waiting for a single event latch-up to clear.

17. The method of claim 16, wherein the measured current exceeding the first threshold is a quiescent mode current measured during a quiescent mode of the first circuit block.

18. The method of claim 17, wherein the measured quiescent mode current exceeding the first threshold is indicative of a latch-up condition within the first circuit block.

19. The method of claim 16, wherein the supply voltage is restored to the nominal voltage value after a predetermined time period from reducing the supply voltage of the first circuit block from the nominal voltage value.

20. The method of claim 16, wherein the semiconductor device includes a second circuit block and wherein reducing the supply voltage of the first circuit block to the predetermined voltage value does not affect the supply voltage of the second circuit block.

* * * * *